(12) United States Patent
Jayaraman et al.

(10) Patent No.: US 7,294,394 B2
(45) Date of Patent: Nov. 13, 2007

(54) PHASE CHANGE MATERIAL CONTAINING FUSIBLE PARTICLES AS THERMALLY CONDUCTIVE FILLER

(75) Inventors: Saikumar Jayaraman, Chandler, AZ (US); Paul A. Koning, Chandler, AZ (US); Ashay Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 284 days.

(21) Appl. No.: 11/129,516

(22) Filed: May 13, 2005

(65) Prior Publication Data
US 2005/0214523 A1    Sep. 29, 2005

Related U.S. Application Data

(63) Continuation of application No. 10/071,743, filed on Feb. 8, 2002, now Pat. No. 6,926,955.

(51) Int. Cl.
*B23B 5/16*    (2006.01)
(52) U.S. Cl. .................. 428/323; 428/68; 428/402; 428/645; 428/673; 524/432; 524/437; 524/495; 29/611; 29/620; 29/832
(58) Field of Classification Search .......... 428/323, 428/68, 402, 645, 673, 432, 437, 495; 29/611, 29/832, 620
See application file for complete search history.

(56) References Cited

U.S. PATENT DOCUMENTS

| | | | |
|---|---|---|---|
| 4,606,962 A | 8/1986 | Reylek et al. | |
| 4,612,601 A | 9/1986 | Watari | |
| 4,711,813 A * | 12/1987 | Salyer | 428/402 |
| 4,869,954 A | 9/1989 | Squitieri | |
| 4,914,551 A | 4/1990 | Anschel et al. | |
| 5,062,896 A * | 11/1991 | Huang et al. | 106/287.19 |
| 5,213,715 A | 5/1993 | Patterson et al. | |
| 5,290,904 A | 3/1994 | Colvin et al. | |
| 5,328,087 A * | 7/1994 | Nelson et al. | 228/175 |
| 6,059,952 A | 5/2000 | Kang et al. | |
| 6,114,413 A | 9/2000 | Kang et al. | |
| 6,207,300 B1 | 3/2001 | Koch et al. | |
| 6,340,113 B1 | 1/2002 | Avery et al. | |
| 6,365,973 B1 * | 4/2002 | Koning | 257/772 |
| 6,451,422 B1 * | 9/2002 | Nguyen | 428/323 |

FOREIGN PATENT DOCUMENTS

| | | |
|---|---|---|
| JP | 07179832 A | 7/1995 |
| JP | 02000309773 A | 11/2000 |
| WO | WO 02/11504 A2 | 2/2002 |

* cited by examiner

*Primary Examiner*—David W. Wu
*Assistant Examiner*—Henry S. Hu
(74) *Attorney, Agent, or Firm*—Blakely, Sokoloff, Taylor & Zafman LLP

(57) ABSTRACT

According to one aspect of the invention, a structure and method for providing improved thermal conductivity of a thermal interface material (TIM) made of phase changed polymer matrix and a fusible filler material is disclosed. The TIM may also have a non-fusible filler material and a percentage of a non-phase change polymer added to the phase change polymer matrix. The TIM, used to mate and conduct heat between two or more components, can be highly filled systems in a polymeric matrix where the fillers are thermally more conductive than the polymer matrix.

6 Claims, 5 Drawing Sheets

PHASE CHANGE MATERIAL CONTAINING FUSIBLE PARTICLES AS THERMALLY CONDUCTIVE FILLER

FIELD OF THE INVENTION

This is a Continuation Application of patent application Ser. No. 10/071,743 filed Feb. 8, 2002, now U.S. Pat. No. 6,926,955 which is incorporated herein by reference in its entirety.

BACKGROUND OF THE INVENTION

The need for smaller and faster computer chips has caused a dramatic increase in the power needed to remove from the chip. This is made more difficult by the shrinking of the die and the larger heat flux per unit area. Thermal interface materials (TIMs) have a key function in a flip chip package, i.e. to dissipate heat to allow higher processing speeds. More specifically, thermal interface materials bring the die into good thermal contact with the heat removal hardware.

Thermal interface materials are available in a wide variety of formulas from silicone and non-silicone bases filled with metal oxides. The metal oxide particles provide the high thermal conductivity to the compound. The ability to fill the tiny cavities of mating surfaces will depend on the metal oxide particle sizes. The particles are designed to give the highest thermal conductivity to the compound. The lowest thermal resistance is a combination of high thermal conductivity and the ability of the material to penetrate all of the cavities and fill all the spaces created by any non-flat areas of the two mating surfaces. Thermal grease provides the lowest thermal resistance interface available (not including a soldered type connection). The disadvantage of thermal grease is the inconsistency of application and the problem of keeping it from being messy to use. There are many grease application products available today to help with the ease of use and keeping it where it belongs, such as spraying, screening, sticks and pads (pads are a grease that is dry to the touch).

Attaching a heat sink to a semiconductor package requires that two solid surfaces be brought together into intimate contact. Unfortunately, no matter how well prepared, solid surfaces are never really flat or smooth enough to permit intimate contact. All surfaces have a certain roughness due to microscopic hills and valleys. Superimposed on this surface roughness is a macroscopic non-planarity in the form of a concave, convex or twisted shape. As two such surfaces are brought together, only the hills of the surfaces come into physical contact. The valleys are separated and form air-filled gaps. When two typical electronic component surfaces are brought together, less than one percent of the surfaces may make physical contact with the remainder (99%) of the surfaces separated by a layer of interstitial air. Some heat is conducted through the physical contact points, but much more has to transfer through the air gaps. Since air is a poor conductor of heat, it should be replaced by a more conductive material to increase the joint conductivity and thus improve heat flow across the thermal interface.

Several types of thermally conductive materials can be used as TIMs to eliminate air gaps from a thermal interface including greases, reactive compounds, elastomers, and pressure sensitive adhesive films. All are designed to conform to surface irregularities, thereby eliminating air voids and improving heat flow through the thermal interface.

A TIM can be made from a polymer matrix and a highly thermally conductive filler. TIMs find three application areas in a CPU package: 1) to bring a bare die package into contact with a heat spreader (FIG. 1A), 2) to bring the die into good thermal contact with an integrated heat sink hardware (FIG. 1B), and 3) to bring the heat spreader into contact with OEM applied hardware (FIG. 1B). The TIM placed between the die or die package and heat spreader is called a TIM 1 and the TIM placed between the heat spreader and heat sink hardware is referred to as a TIM 2.

Historically, soft polymers used in TIMs have been silicones, epoxies, urethanes, acrylates and olefins. Filler types have ranged dramatically from inexpensive aluminum oxides and zinc oxide to aluminum, boron nitride, silver, graphite, carbon fibers, and diamond. Phase change TIMs are a class of polymer materials that undergo a transition from a solid to a liquid phase with the application of heat. The phase change TIMs are a soft solid at room temperature but a thick fluid at operating temperature. This transition occurs due to the presence of a low melting solid, typically a wax, mixed with the polymer in the presence of highly conductive filler. Due to the transition, phase change materials readily conform to surfaces and provide low thermal resistance and higher heat removal capability.

A heatpipe is a heat transfer or heat sink structure that can include a number of channels for transferring heat from one end to a condenser region at the other end. Each heatpipe can be composed of a central vapor channel with a number of parallel capillary channels (not shown), each of which is open on one side to the vapor channel thereby serving as the wick of the heat pipe, running the length of the heatpipe to a condenser region. The heat from the microchip vaporizes a working fluid in the capillaries and the vapor in turn travels in the vapor channel to the condenser region to be cooled and condensed by a cooling medium, such as air, present over this region.

When a heatpipe is used, a heatpipe surface contacting the circuit package can have a cross-section smaller than the circuit package it contacts and a portion of the circuit package may extend out beyond the heatpipe edges. As a result, heat transfer may not be as efficient as required and a thermal adaptor such as a spreader plate may be used as a heat spreader to compensate. To improve thermal conduction between the heatpipe and the circuit package, the spreader plate can have a surface area and shape that more closely matches with the circuit package when the spreader plate is positioned between the heatpipe and the circuit package.

FIG. 2 is an illustration of an arrangement of a non-fusible particle filler material within the polymer matrix of a TIM. The non-fusible particles, such as metals, benefit from a high thermal conductivity, however, a thermal flow path through the TIM is limited by the point-to-point contact of the particles as shown by the arrows. Within the TIM, these particles being non-fusible (i.e. will not melt and flow during normal processing and so remain as point contacts with each other) result in thermal conductivity through the TIM that is a mechanism referred to as percolation. The phenomenon of percolation describes the effects of interconnections present in a random system, here the number of filler particles that are randomly in point contact with each other to allow thermal conduction. Normally, to improve conduction limited by percolation, the amount of filler could be increased until a threshold amount is reached and heat conduction due to the filler, transitions to a sufficiently high value. The degree of filler required to reach this transition level may be too high and can overpower the properties desired from the polymer binder such as low contact resistance. Another problem is that for some metal particles in contact with some polymer binders, the bare particle filler can poison the polymer cure such as by hindering or blocking the curing agent.

DETAILED DESCRIPTION OF THE INVENTION

Figures 1A, 1B:
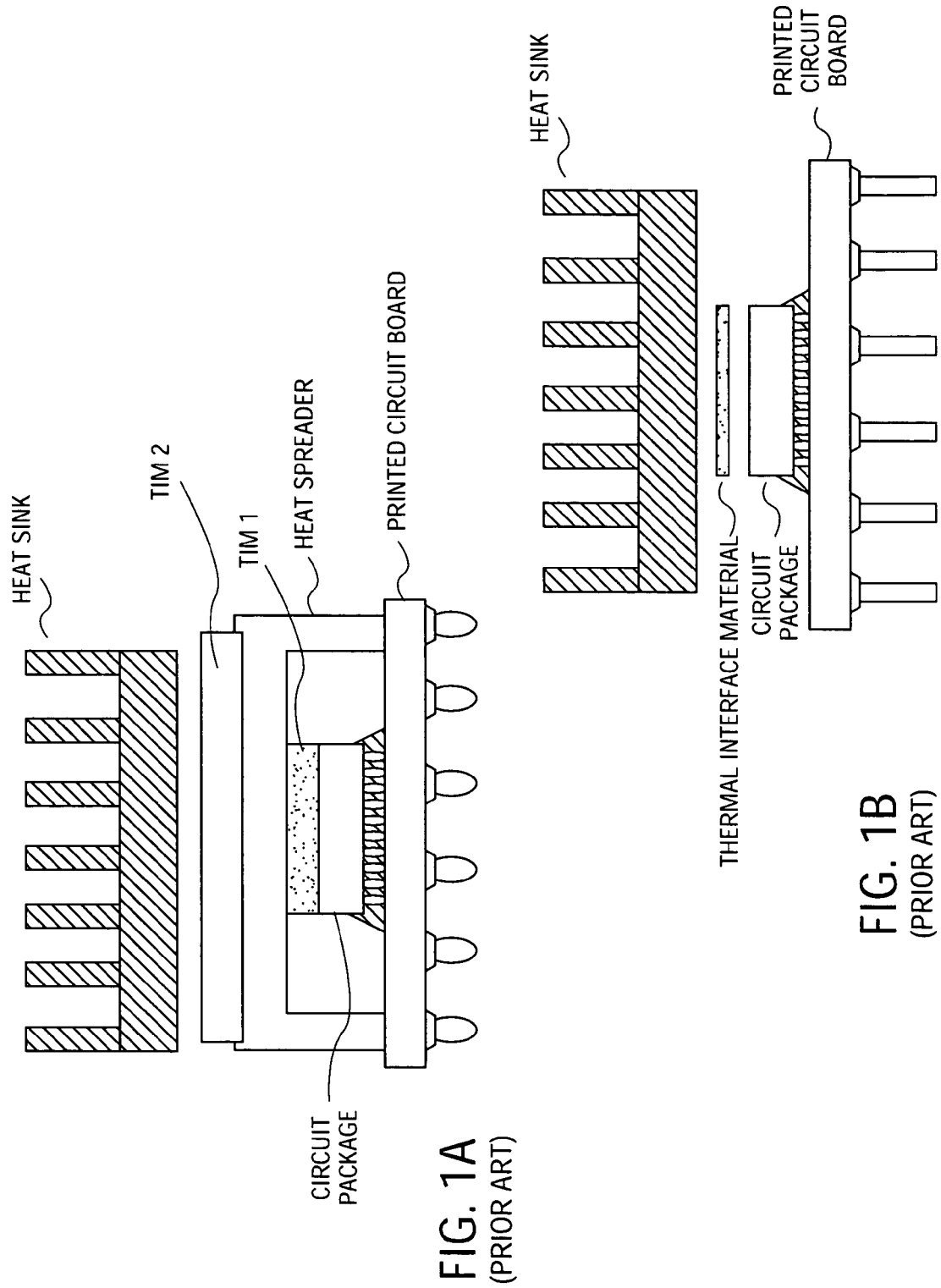
FIG. 1A is an illustration of an expanded view of a heat sink, a TIM 2, a heat spreader, a TIM 1, a circuit package, and a printed circuit board.
FIG. 1B is an illustration of an expanded view of a heat sink, a TIM, a circuit package, and a printed circuit board.
Figure 2:
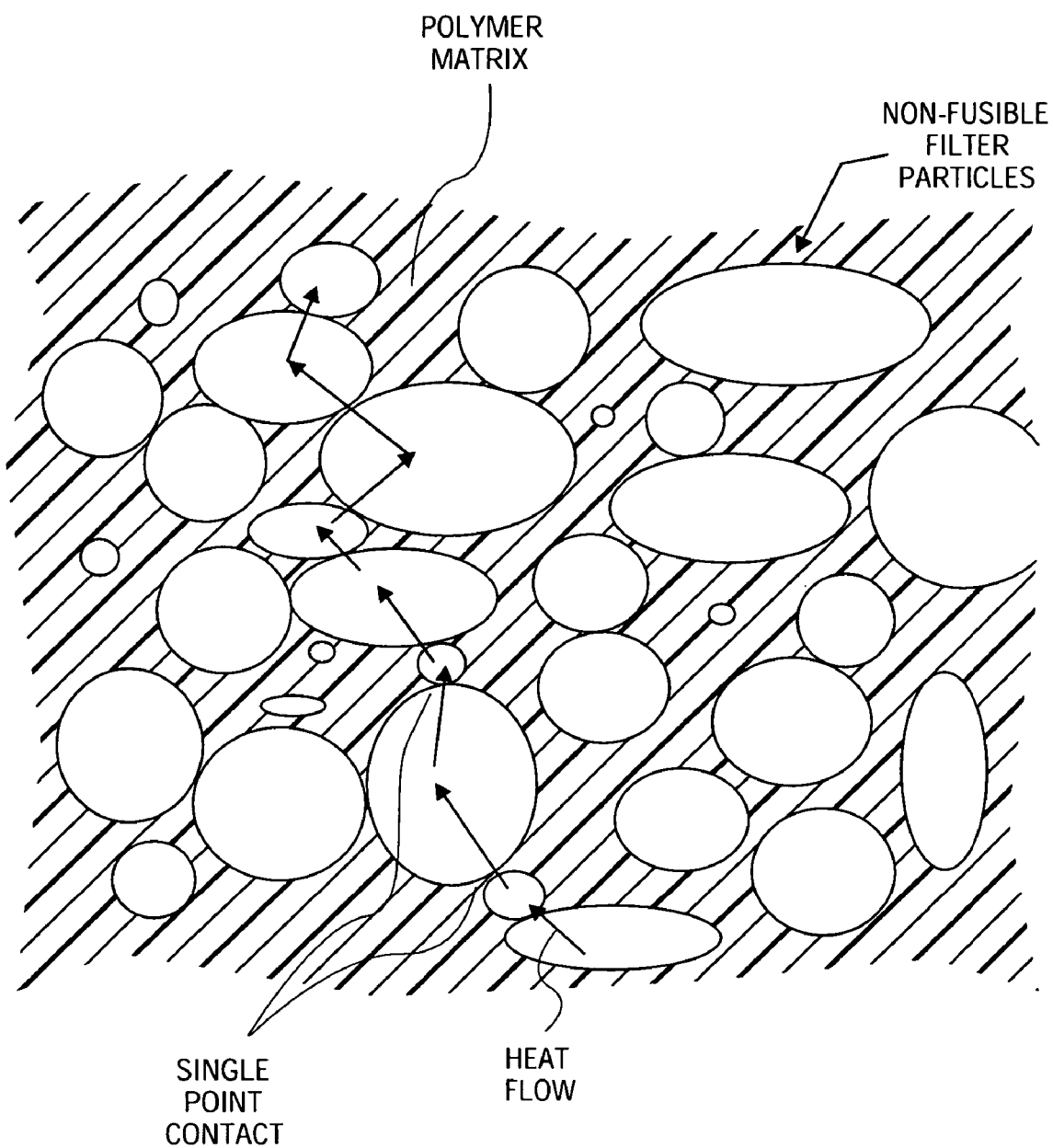
FIG. 2 is an illustration of non-fusible particle filler material within a polymer matrix of a thermal interface material.

A structure and method is disclosed for providing improved thermal conductivity of a thermal interface material (TIM) made of a phase change polymer matrix and a fusible filler material. The TIM may also have non-fusible filler material and a percentage of non-phase change polymer added to the phase change polymer matrix. The TIM, used to mate and conduct heat between two or more components, can be highly filled systems in a polymeric matrix where the fillers are thermally more conductive than the polymer matrix. In one application, the TIM, in dispensable form or in sheet form, can be applied between a die or circuit package, and a heat spreader, i.e. a TIM 1, and a second TIM applied to the heat spreader between the heat spreader and the heat sink, i.e. a TIM 2. The heat spreader, which could be a composite or a metal such as Al (aluminum), AlN (aluminum nitride), or Cu (copper), is placed between computer components such as the die and heat sink to conduct heat away from the die. In the following description, numerous specific details are set forth such as specific materials, equipment, and processes in order to provide a thorough understanding of the present invention. In other instances, well known computer assembly techniques and machinery have not been set forth in detail in order to minimize obscuring the present invention.

To remove more heat from the die during operation, thermal performance can be increased by adding a phase change polymer, such as a silicone, combined with fusible fillers, such as solder powders, to form a polymer-solder hybrid TIM. During cure, the solder particles liquefy to connect forming networks that are columnar structures with high thermal conductivity. This in turn enhances the flow of heat between the two interfaces. This formation of a columnar structure between the two surfaces in contact, i.e. die and heat sink for a TIM, die and heat spreader or heat sink for TIM 1, and heat spreader and heat sink for TIM 2, improves the ability of the material to dissipate heat generated by the die significantly.

The further addition of non-fusible fillers to create a TIM that has a blend of fusible and non-fusible fillers in the phase change polymer material strengthens the TIM mechanical properties and also can improve filler uniformity within the TIM. The fundamental mechanism of heat conduction in mixed-filler phase change polymer matrix TIMs is primarily a combination of percolation between the non-fusible filler particles and thermal conduction through solder bridges that connect the non-fusible fillers, thereby lowering particle contact resistances. The contact resistances at the metal-TIM interfaces on the die and the heat sink are also lowered due to fusible solder wetting and adhering to these interfaces.

At assembly, the phase change TIM can be placed between the mating hardware and a compressive force can be applied to the sandwiched components. A reflow operation can then be accomplished that heats up the component stack and can cause any fusible solder filler material within the polymer binder to liquefy and flow. The times and temperatures for the reflow operation can vary depending on the type and amount of filler and polymer binder used. The temperature range for a reflow operation can be in the range of approximately 150-400 degrees F. Once liquid, the fusible solder can form columnar shapes that provide thermal conductive paths, which will increase the overall thermal conductivity of the TIM.

Phase change materials are generally olefinic polymer based and have the characteristics of changing from a solid to a liquid at predetermined temperatures. The polymer binder can have the phase change material mixed with another polymer such as, for example, a thermoplastic. The phase change material may not have good thermal conductivity in its initial state. When the temperature is increased by the heat from a mating component or the ambient around it, the phase change material will change state to a liquid and flow into the cavities of the mating surfaces such as on a heat sink, spreader plate, or device. This flow of the thermal interface material fills the cavities with the thermal interface material and therefore provides a low thermal resistance. The thermal interface material can change back to a solid when the temperature is lowered, such as by removing power from the device.

There are many phase change materials with numerous additives to lower the thermal resistance. Thermal interface materials are applied in different thicknesses where the thickness variations can have more to do with the flatness issue then the cavities. Some of the thermal interface material types are designed to flow easier when they melt in order to provide a thinner end result and therefore a lower thermal resistance. A compromise is to allow easy flow and still keep it in place using surface tension. Relatively low application forces are required in mounting the device to these phase change materials where typical forces could be in the 5 to 30 pound area.

Figure 3:
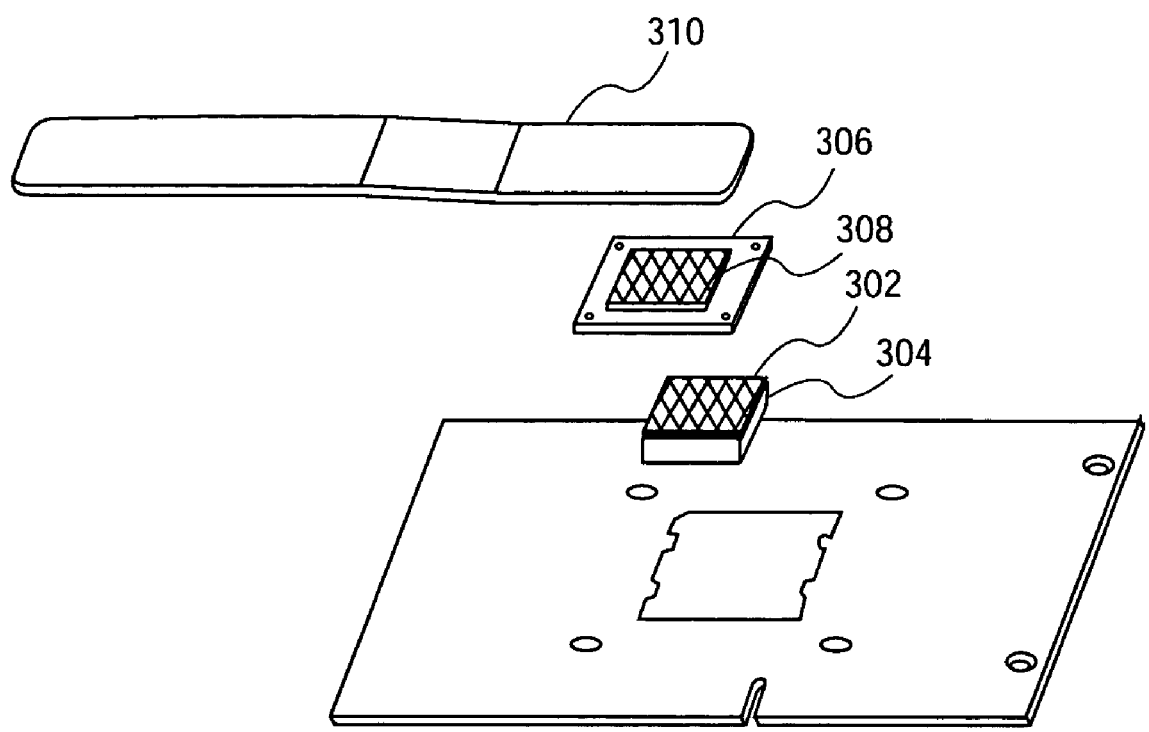
FIG. 3 is an illustration of an exploded view of thermal interface materials placed between computer components.

FIG. 3 is an illustration of one embodiment of mixed-filler phase change polymer matrix TIMs placed between computer components. A first mixed-filler phase change polymer matrix TIM (TIM 1) 302 can thermally connect a circuit package 304 to a spreader plate 306 and a second mixed-filler phase change polymer matrix TIM (TIM 2) 308 can thermally connect the spreader plate 306 to a heat sink such as a heatpipe 310. The formulation for the two TIMs may be the same or can be different in both the type of phase change polymer matrix as well as the materials and blend ratios for the fusible and non-fusible fillers.

Figures 4A, 4B:
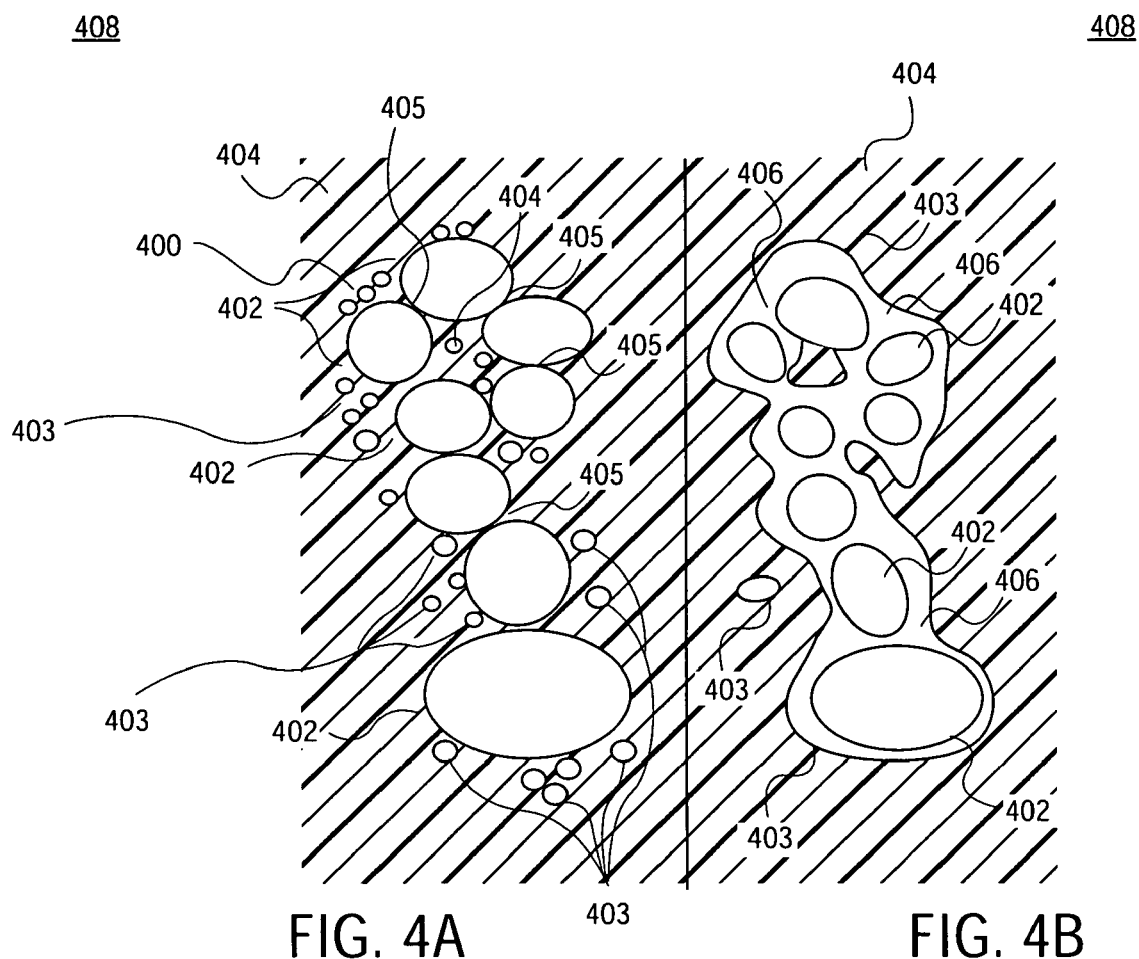
FIG. 4A is an illustration of one embodiment of a fusible particle filler and a non-fusible particle filler in a phase change polymer matrix before reflow.
FIG. 4B is an illustration of the one embodiment of the fusible and non-fusible filler in the phase change polymer matrix after reflow.

FIG. 4A is an illustration of one embodiment of a thermal interface material having both fusible filler and non-fusible filler in the phase change polymer matrix. FIG. 4A represents the TIM 408 after the ingredients have been mixed together but before a reflow operation has occurred. As mentioned, one advantage for using phase change material in a TIM 408 is to provide higher thermal performance. The higher thermal performance is a result of the liquid phase, which can reduce thermal losses due to contact resistance while providing excellent conformability to the surfaces in contact. Phase change materials can be used as a binder in a TIM, TIM 1, or TIM 2, either as dispensable or as a sheet, and offering reworkability or non-reworkability thus providing a multitude of ways to use. The highly thermally conductive non-fusible filler particles 402 can be mixed with the less thermally conductive fusible filler 403 and then blended into the phase change polymer binder 404 (least thermally conductive material in the TIM) where the mixture creates single contact points 405 by the non-fusible particles 402.

FIG. 4B is an illustration of the fusible filler and the non-fusible particles in a polymer matrix after a reflow operation. During reflow, the fusible filler 403 wets the surface of the non-fusible particles 402, coalesces and generally fuses the non-fusible particles 402 together creating in the process larger cross-sections 406 of continuous pathways for heat conduction. A result of fusible filler 403 flow and the increased cross-sectional areas 406 joining fusible particles 402, is that higher thermal conductivity can be created through the larger pathways than can be achieved via percolation by point contacts when using only non-fusible particle fillers.

In addition, any fusible filler contact areas with the mating computer components (die, spreader, etc, FIG. 3) can be wetted out providing good thermal transfer across these contact area. When using fusible filler 403 with non-fusible filler 402, the amount of total filler 402 and 403 needed to obtain a value of thermal conductivity for the TIM 408 can be lower than when using only non-fusible particle filler 402.

A partial list of fusible filler material 403 that can be added may be metals and metal alloys such as In, InBi, InSn, BiSn, PbSn, SnAg, InPbAg, InAg, InSnBi, InGa, SnBiZn, SnInAg, SnAgCu, SnAgBi and InPb. The fusible filler materials can be in the form of a powder. The fusible filler materials can be in the form of a solder having a low melting temperature and where there can be additives such as resins to aid in the flow and wetting of the mating surfaces and to the non-fusible particles. A partial list of non-fusible particle filler material 403 that can be added to the mixed-filler phase change polymer matrix are aluminum oxides, zinc oxide, aluminum, boron nitride, silver, graphite, carbon fibers, diamond, and metal coated fillers such as, for example, metal coated carbon fiber or metal coated diamond. The total weight of filler to total weight of mixed-filler phase change polymer matrix TIM can be in the range of approximately 10-95% filler. The total weight of fusible filler can be in the range of approximately 60-90% by weight of the total weight of the thermal interface material. The total weight of non-fusible filler can be in the range of approximately 5-50% by weight of the total weight of the thermal interface material. The fusible filler material can have a melting temperature approximately in the range of 100-250° C. The material choice for non-fusible material may exclude lead, cadmium, mercury, antimony, and arsenic due to contamination and safety hazard concerns.

Finally, when selecting the phase change material, forming a polymer matrix may be a blend of both phase change material and non-phase change material to tailor the properties desired in the polymer matrix.

Figure 5:
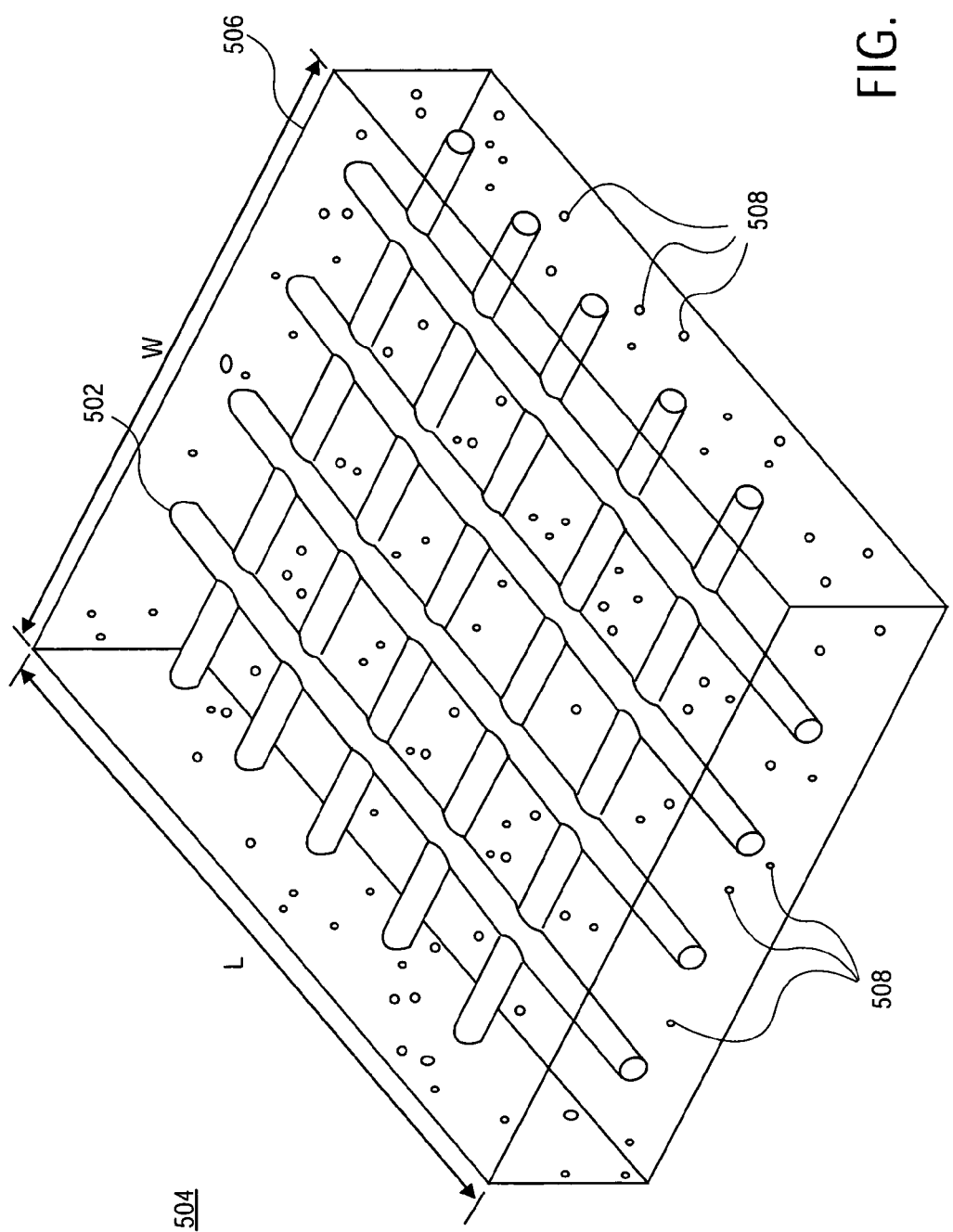
FIG. 5 is an illustration of one embodiment of a non-fusible mesh within a thermal interface material.

FIG. 5 is an illustration of one embodiment of a mesh added to the TIM. The TIM 504 can use a phase change material 506 that is highly cross-linked, partially cross-linked, not cross-linked, or blends thereof. During a reflow assembly operation, however, the less cross-linked polymers with fusible filler 508 may compress with heat and assembly forces until there is contact between the two mating components (none shown). A hard stop may be placed within the TIM 504 to maintain a minimum bond gap between the components. The hard stop may be in the form of a mesh 502 made of non-fusible materials and that are highly thermally conductive. Mesh material that can be used includes aluminum, alumina, silver, aluminum nitride, silica coated aluminum nitride, boron nitride, carbon fiber, diamond and other metal coated inorganic compounds. The mesh material 502 can be in large sheet form when added to the TIM 504, also in sheet form. As a result, the mesh 502 can be approximately a continuous piece when the TIM 504 is cut to shape for use. Alternatively, the mesh material 502 may be smaller pieces of mesh added to the TIM 504 where in one embodiment, the mesh pieces can have an approximate shape that is 0.1" square. As shown in FIG. 5, the mesh 502 should lie flat within the TIM 504, i.e. flat with the length (L) and width (W) of the TIM 504 so as to limit a bond gap between components (not shown) to the thickness of the mesh 502.

The following is a description of one embodiment of a phase change TIM. The polymer matrix, including the phase change material, can be made up of polyolefins, epoxies, polyesters, acrylics, etc. comprising approximately 8% of the thermal interface material by weight. The solder material can be indium comprising 77% of the thermal interface material by weight. Indium has a melting temperature of 157° C. and does not attack phase change resin when melted at a temperature above 157° C. The non-fusible particles can be aluminum comprising 15% of the thermal interface material by weight. The solder particles and the non-fusible particles thus comprise approximately 92% of the thermal interface material by weight Aluminum has a melting temperature of approximately 1200° C., the filler particles thus melt at a temperature which is 1043° C. higher than a melting temperature of the solder particles.

The composition is heated from room temperature of approximately 30° C. to approximately 170° C., which is above the melting temperature of indium so that the indium solder particles melt. The composition is maintained at 170° C. for approximately two minutes, i.e. until sufficient agglomeration has occurred. The composition is then cooled to a temperature of approximately 125° C., which is below the solder material's melting point and the solder particles solidify. Curing time and temperature may be varied and are related to one another.

Heat is generated by the die and transferred through the filler particles to the thermally conductive member (integrated heat spreader or heat sink). Differences in thermal expansion of the die and the thermally conductive member cause stresses on the material that are primarily absorbed by the phase change matrix material. The resistance to heat flow is characterized by a term, $R_{jc}$, which indicates the thermal resistance between the die junction and the top surface of the conductive member.

Such TIM material can be applied via various assembly methods. With such phase change TIM material pre applied (screen printing, perform, etc.) to the thermal conductive member (such as the heat spreader or heat sink), package assembly builds showed an average $R_{jc}$ of 0.17-0.18° C. cm$^2$/W. With the phase change TIM material dispensed, package assembly builds showed an average $R_{jc}$ of 0.18-0.19° C. cm$^2$/W. The phase change TIM material placed between the die surface and only a copper plate as the heat sink, showed package assembly builds with an average Rjc of 0.22-0.23° C. cm²/W.

The present invention takes advantage of fusible material flow to improve thermal conductivity that would otherwise occur by percolation (non-fusible particle-particle contact only). This advantage is gained by producing larger continuous thermal pathways adding to the point-to point non-fusible particle contact in a phase change polymer matrix. The fusible and non-fusible filler mix can produce a TIM having higher overall heat conductivity than a non-fusible particle filled TIM for a given amount of filler by percent weight.

What is claimed is:

1. An electronic assembly comprising:
   a microelectronic die;
   a heat sink; and
   a thermal interface material between the microelectronic die and the heat sink, the thermal interface material comprising a phase change polymer, a solder material, and a plurality of thermally conductive non-fusible particles, the solder material interconnecting the non-fusible particles to form a plurality of columnar structures within the phase change polymer.

2. The electronic assembly of claim 1, wherein the thermal interface material further comprises a non-phase change polymer.

3. The electronic assembly of claim 1, wherein the phase change polymer is a liquid above 45° C.

4. The electronic assembly of claim 1, wherein a non-fusible mesh is placed within the phase change polymer of the thermal interface material.

5. The electronic assembly of claim 1, wherein the non-fusible particles include at least one of glass fiber, graphite fibers, carbon fibers, boron nitride, aluminum oxides, zinc oxide, aluminum, boron nitride, silver, graphite, carbon fibers, diamond, metal coated carbon fiber, and metal coated diamond.

6. The electronic assembly of claim 5, wherein the non-fusible particles are excluded from the group consisting of lead, cadmium, mercury, antimony and arsenic.

* * * * *